United States Patent
Sandhu et al.

(10) Patent No.: US 10,270,416 B2
(45) Date of Patent: Apr. 23, 2019

(54) ELECTRONIC FILTER CIRCUIT

(71) Applicant: ARM Limited, Cambridge (GB)

(72) Inventors: Bal S. Sandhu, Fremont, CA (US);
Mudit Bhargava, Austin, TX (US);
Akshay Kumar, New Delhi (IN);
Piyush Agarwal, Noida (IN);
Shidhartha Das, Upper Cambourne (GB)

(73) Assignee: Arm Limited, Cambridge (GB)

( * ) Notice: Subject to any disclaimer, the term of this patent is extended or adjusted under 35 U.S.C. 154(b) by 128 days.

(21) Appl. No.: 15/410,922

(22) Filed: Jan. 20, 2017

(65) Prior Publication Data

US 2018/0212582 A1 Jul. 26, 2018

(51) Int. Cl.
*H03H 7/06* (2006.01)
*H03H 7/065* (2006.01)
*H03H 7/01* (2006.01)
*H01L 27/10* (2006.01)
*H01L 45/00* (2006.01)

(52) U.S. Cl.
CPC ............ *H03H 7/065* (2013.01); *H01L 27/10* (2013.01); *H01L 45/04* (2013.01); *H03H 7/0153* (2013.01); *H03H 7/06* (2013.01)

(58) Field of Classification Search
CPC ......... H03H 7/06; H03H 7/0153; H03H 7/065
USPC .................................................. 333/172, 174
See application file for complete search history.

(56) References Cited

U.S. PATENT DOCUMENTS 7,778,063 B2 * 8/2010 Brubaker ............ H01L 27/2409
365/148
2017/0033782 A1 * 2/2017 Shifren .............. G11C 13/0069

FOREIGN PATENT DOCUMENTS

JP          2009 224718       10/2009
WO     WO 2017/025760        2/2017

* cited by examiner

*Primary Examiner* — Rakesh B Patel
(74) *Attorney, Agent, or Firm* — Leveque IP Law, P.C.

(57) ABSTRACT

Many kinds of filters are found in electronic circuits and provide a range of signal processing applications. Such filters can be passive, active, analog or digital and work across a range of frequencies. Present techniques provide an electronic filter circuit comprising resistive and capacitive elements, wherein a resistive element of the filter circuit is provided by a correlated electron material device.

18 Claims, 12 Drawing Sheets

Oscillator Frequency, fc (if R1 = R2), $fc = \dfrac{1}{2\ln(3)RC}$

ELECTRONIC FILTER CIRCUIT

FIELD OF THE DISCLOSURE

The present techniques relate to electronic filter circuits. Electronic filter circuits typically comprise resistive and capacitive elements. Furthermore, the techniques relate to filter circuits incorporating a correlated electron material and methods of operation and programming thereof.

BACKGROUND

Many kinds of filters are found in electronic circuits and provide a range of signal processing applications. Such filters can be passive, active, analogue or digital and work across a range of frequencies. Many filters work in part based upon a resistive property, control of which provides control over the filter's properties and its application.

SUMMARY OF INVENTION

The present techniques include correlated electron switches in the design of tuneable filters for analogue or RF circuits.

Present techniques seek to provide advantages when using Correlated Electron Switch (CES) elements in passive or active filter networks for analogue or RF circuits. Such advantages may include:

1. Tuning a circuit on silicon to correct a particular Bandwidth or Gain function without having to make a mask change and re-spin the silicon. Hence, the circuit transfer function can be "fixed" directly on silicon using the non-volatile programmability feature of CES elements;

2. The CES elements have much lower variability (<10%) compared with conventional diffused resistors made with other materials. For example, N-well resistor can vary +/−30% on silicon due to manufacturing variations;

3. The CES elements have lower temperature variation (<10%);

4. The CES elements will take 100x-1000x lower area. For example, to create a 100 kΩ N-well resistor which has an Rs~1 k/sq, may take 100 squares. This 100 kΩ resistor may be created with using 1 sq. equivalent area (VIA area) with a CES element programmed in the low resistance state. Hence, making large MΩ resistors for narrow-band applications can be achieved with more efficient fabrication processes than state of the art.

Accordingly, in a first aspect of present techniques there is provided an electronic filter circuit comprising resistive and capacitive elements, wherein a resistive element of the filter circuit is provided by a correlated electron material device.

BRIEF DESCRIPTION OF THE DRAWINGS

The techniques are diagrammatically illustrated, by way of example, in the accompanying drawings, in which.

DETAILED DESCRIPTION

Figure 1A:
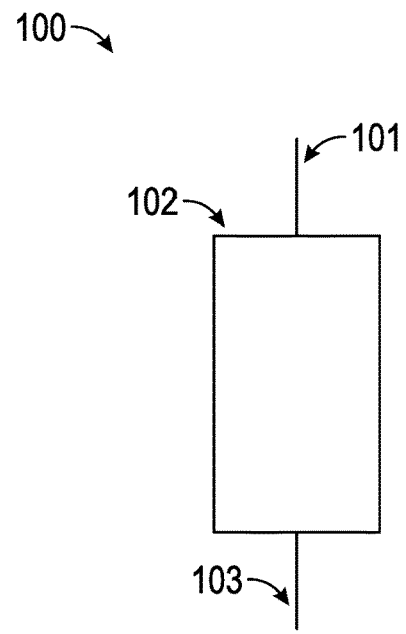
FIG. 1A is block diagram of an example embodiment of a correlated electron switch device comprising a correlated electron material, in accordance with an embodiment.

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Further, it is to be understood that other embodiments may be utilized. Furthermore, structural and/or other changes may be made without departing from claimed subject matter. It should also be noted that directions and/or references, for example, such as up, down, top, bottom, and so on, may be used to facilitate discussion of drawings and/or are not intended to restrict application of claimed subject matter. Therefore, the following detailed description is not to be taken to limit claimed subject matter and/or equivalents.

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

As utilized herein, the terms "coupled", "connected," and/or similar terms are used generically. It should be understood that these terms are not intended as synonyms. Rather, "connected" is used generically to indicate that two or more components, for example, are in direct physical, including electrical, contact; while, "coupled" is used generically to mean that two or more components are potentially in direct physical, including electrical, contact; however, "coupled" is also used generically to also mean that two or more components are not necessarily in direct contact, but nonetheless are able to co-operate and/or interact. The term coupled is also understood generically to mean indirectly connected, for example, in an appropriate context.

The terms, "and", "or", "and/or" and/or similar terms, as used herein, include a variety of meanings that also are expected to depend at least in part upon the particular context in which such terms are used. Typically, "or" if used to associate a list, such as A, B or C, is intended to mean A, B, and C, here used in the inclusive sense, as well as A, B or C, here used in the exclusive sense. In addition, the term "one or more" and/or similar terms is used to describe any feature, structure, and/or characteristic in the singular and/or is also used to describe a plurality and/or some other combination of features, structures and/or characteristics. Likewise, the term "based on" and/or similar terms are understood as not necessarily intending to convey an exclusive set of factors, but to allow for existence of additional factors not necessarily expressly described. Of course, for all of the foregoing, particular context of description and/or usage provides helpful guidance regarding inferences to be drawn. It should be noted that the following description merely provides one or more illustrative examples and claimed subject matter is not limited to these one or more illustrative examples; however, again, particular context of description and/or usage provides helpful guidance regarding inferences to be drawn.

Particular embodiments of the present disclosure incorporate correlated electron material (CEM) to form a correlated electron switch (CES) in a filter circuits. In this context, a CES may exhibit a substantially abrupt conductor/insulator transition arising from electron correlations rather than solid state structural phase changes (e.g., crystalline/amorphous in phase change memory (PCM) devices or filamentary formation and conduction in resistive RAM devices). In one embodiment, a substantially abrupt conductor/insulator transition in a CES may be responsive to a quantum mechanical phenomenon, in contrast to melting/solidification or filament formation, for example. As used herein, the terms "conductive state", "lower impedance state", and/or "metal state" may be interchangeable, and/or may at times be referred to as a "conductive/lower impedance state." Similarly, the terms "insulative state" and "higher impedance state" may be used interchangeably herein, and/or may at times be referred to as an "insulative/higher impedance state."

A quantum mechanical transition of correlated electron switch material between an insulative/higher impedance state and a conductive/lower impedance state may be understood in terms of a Mott transition. In a Mott transition, a material may switch from an insulative/higher impedance state to a conductive/lower impedance state if a Mott transition condition occurs. The Mott criteria is defined by $(n_C)^{1/3} a \approx 0.26$, where $n_C$ is a concentration of electrons and "a" is the Bohr radius. When a critical carrier concentration is achieved such that the Mott criteria is met, the Mott transition will occur and the state of the CES will change from a higher resistance/higher capacitance state (that is, an insulative/higher impedance state) to a lower resistance/lower capacitance state (that is, a conductive/lower impedance state).

The Mott transition may be controlled by a localization of electrons. When carriers are localized, the strong coulomb interaction between the electrons splits the bands of the CEM to create an insulator. When electrons are no longer localized, the weak coulomb interaction dominates and the band splitting is removed, resulting in a metal (conductive) band. This is sometimes explained as a "crowded elevator" phenomenon. While an elevator has only a few people in it, the people can move around easily, which is analogous to a conductive/lower impedance state. While the elevator reaches a certain concentration of people, on the other hand, the people can no longer move, which is analogous to the insulative/higher impedance state. However, it should be understood that this classical explanation provided for illustrative purposes, like all classical explanations of quantum phenomenon, is only an incomplete analogy, and that claimed subject matter is not limited in this respect.

Further, in an embodiment, switching from an insulative/higher impedance state to a conductive/lower impedance state may bring about a change in capacitance in addition to a change in resistance. For example, a CES may include the property of variable resistance together with the property of variable capacitance. That is, impedance characteristics of a CES device may include both resistive and capacitive components. For example, in a metal state, a CEM may have substantially zero electric field, and therefore substantially zero capacitance. Similarly, in an insulative/higher impedance state (in which electron screening may be very imperfect due to lower density of free electrons), an external electric field may be capable of penetrating the CEM and therefore the CEM will have capacitance due to a physical change in the dielectric function of the CEM. Thus, for example, a transition from an insulative/higher impedance state to a conductive/lower impedance state in a CES may result in changes in both resistance and capacitance, in an embodiment.

In an embodiment, a CES device may switch impedance states responsive to a Mott-transition in a majority of the volume of the CEM of a CES device. In an embodiment, a CES device may comprise a "bulk switch." As used herein, the term "bulk switch" refers to at least a majority volume of a CEM of a CES device switching impedance states, such as responsive to a Mott-transition. For example, in an embodiment, substantially all of a CEM of a CES device may switch from an insulative/higher impedance state to a conductive/lower impedance state or from a conductive/lower impedance state to an insulative/higher impedance state responsive to a Mott-transition. In an embodiment, a CEM may comprise one or more transition metal oxides (TMO), one or more rare earth oxides, one or more oxides of one or more f-block elements of the periodic table, one or more rare earth transitional metal oxide perovskites, yttrium, and/or ytterbium, although claimed subject matter is not limited in scope in this respect. In an embodiment, a device, such as CES device, may comprise CEM including one or more materials selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof, although claimed subject matter is not limited in scope in this respect.

FIG. 1A shows an example embodiment of a CES device 100 comprising CEM, such as material 102, sandwiched between conductive terminals, such as conductive terminals 101 and 103. In an embodiment, a CES device, such as CES device 100, may comprise a variable impeder device. As utilized herein, the terms "correlated electron switch" and "variable impeder" may be interchangeable. At least in part through application of a critical voltage and a critical current between the terminals, such as between conductive terminals 101 and 103, the CEM, such as material 102, may transition between the aforementioned conductive/lower impedance state and insulative/higher impedance state. As mentioned earlier, CEM, such as material 102, in a variable impeder device, such as CES device 100, may transition between a first impedance state and a second impedance state due to a quantum mechanical transition of the correlated electron switch material because of an applied critical voltage and an applied critical current, as described in more detail below. Also, as mentioned above, a variable impeder device, such as variable impeder device 100, may exhibit properties of both variable resistance and variable capacitance.

In a particular embodiment, a variable impeder device, such as CES device 100, may comprise a CEM that may transition between or among a plurality of detectable impedance states based, at least in part, on a transition of at least a majority portion of the CEM between an insulative/higher impedance state and a conductive/lower impedance state due to a quantum mechanical transition of the correlated electron switch material. For example, in an embodiment, a CES device may comprise a bulk switch, in that substantially all of a CEM of a CES device may switch from an insulative/higher impedance state to a conductive/lower impedance state or from a conductive/lower impedance state to an insulative/higher impedance state responsive to a Mott-transition. In this context, an "impedance state" means a detectable state of a variable impeder device that is indicative of a value, symbol, parameter and/or condition, just to provide a few examples. In one particular embodiment, as described below, an impedance state of a CES device may be detected based, at least in part, on a signal detected on terminals of the CES device in a read and/or sense operation. In another particular embodiment, as described below, a CES device may be placed in a particular impedance state to represent or store a particular value, symbol, and/or parameter, and/or to achieve a particular capacitance value for the CES device by application of one or more signals across terminals of the CES device in a "write" and/or "program" operation, for example. Of course, claimed subject matter is not limited in scope to the particular example embodiments described herein.

Figure 1B:
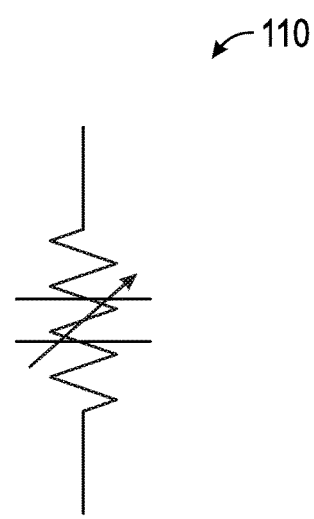
FIG. 1B is an example symbol for a correlated electron switch.

FIG. 1B depicts an example symbol 110 that may be utilized, for example, in electrical circuit schematic diagrams to notate a CES/variable impeder device. Example symbol 110 is meant to remind the viewer of the variable resistance and variable capacitance properties of a CES/variable impeder device, such as CES device 100. Example symbol 110 is not meant to represent an actual circuit diagram, but is merely meant as an electrical circuit diagram symbol. Of course, claimed subject matter is not limited in scope in these respects.

Figure 2:
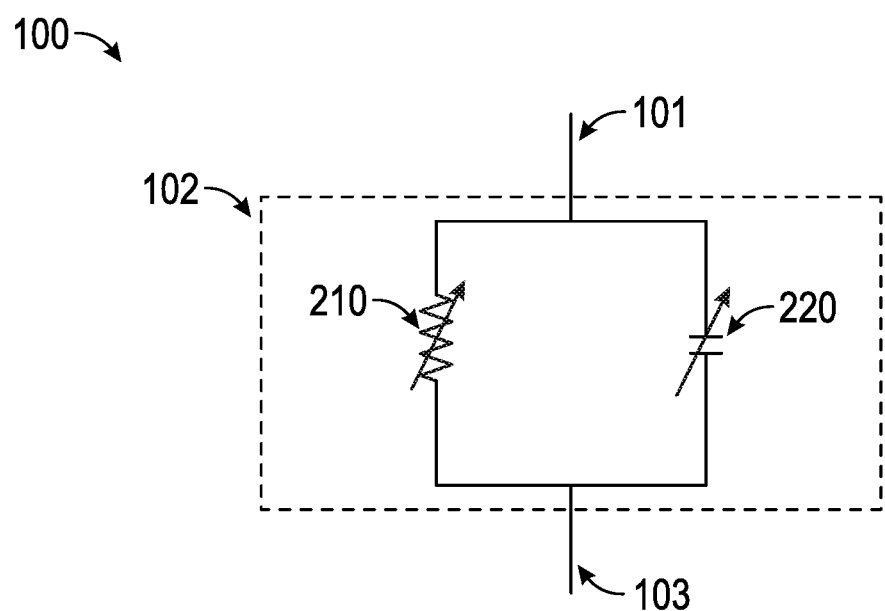
FIG. 2 is an example equivalent circuit for a correlated electron switch.

FIG. 2 depicts a schematic diagram of an equivalent circuit of an example CES/variable impeder device, such as CES device 100. As mentioned, a CES/variable impeder device may comprise characteristics of both variable resistance and variable capacitance. That is, the impedance characteristics of a CES/variable impeder device, such as CES device 100, may depend at least in part on the resistance and capacitance characteristics of the device. For example, an equivalent circuit for a variable impeder device may, in an embodiment, comprise a variable resistor, such as variable resistor 210 in parallel with a variable capacitor, such as variable capacitor 220. Of course, although a variable resistor 210 and variable capacitor 220 are depicted in FIG. 2 as comprising discrete components, a variable impeder device, such as CES 100, may comprise a substantially homogenous CEM, such as CEM 102, wherein the CEM comprises characteristics of variable capacitance and variable resistance.

Table 1 below depicts an example truth table for an example variable impeder device, such as CES device 100.

TABLE 1

| Correlated Electron Switch Truth Table | | |
|---|---|---|
| Resistance | Capacitance | Impedance |
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

In an embodiment, the example truth table shown in Table 1 shows that a resistance of a variable impeder device, such as CES device 100, may transition between a lower resistance state and a higher resistance state that is a function, at least in part, of a voltage applied across the CEM. In an embodiment, a resistance of a lower resistance state may be 10 to 100,000 times lower than a resistance of a higher resistance state, although claimed subject matter is not limited in scope in this respect. Similarly, Table 1 shows that a capacitance of a variable impeder device, such as CES device 100, may transition between a lower capacitance state, which for an example embodiment may comprise approximately zero, or very little, capacitance, and a higher capacitance state that is a function, at least in part, of a voltage applied across the CEM. Also, as shown in Table 1, a variable impeder device's transition from a higher resistance/higher capacitance state to a lower resistance/lower capacitance state may be represented as a transition from a higher impedance state to a lower impedance state. Similarly, a transition from a lower resistance/lower capacitance state to a higher resistance/higher capacitance state may be represented as a transition from a lower impedance state to a higher impedance state.

It should be noted that a variable impeder, such as CES 100, is not a resistor, but rather comprises a device having properties of both variable capacitance and variable resistance. In an embodiment, resistance and/or capacitance values, and therefore impedance values, depend, at least in part, on an applied voltage.

Figure 3:
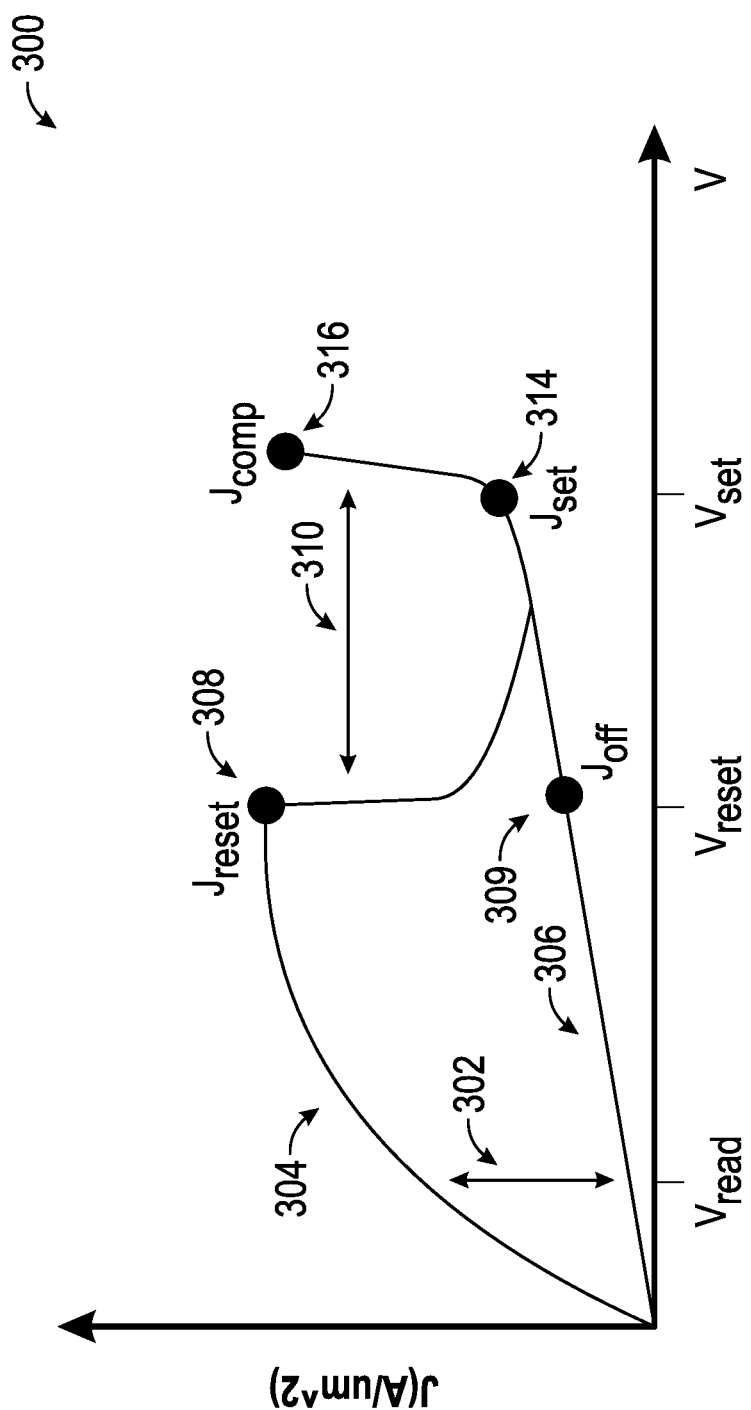
FIG. 3 shows an example plot of current density against voltage for a correlated electron switch.

FIG. 3 shows a plot of current density against voltage across electrically conductive terminals, such as electrically conductive terminals 101 and 103, of a CES device, such as example CES device 100, according to an embodiment. Based, at least in part, on a voltage applied to terminals of a variable impeder device (e.g., in a write operation), such as variable impeder device 100, a CEM, such as CEM 102, may be placed in a conductive/lower impedance state or an insulative/higher impedance state. For example, application of a voltage $V_{reset}$ and current density $J_{reset}$ may place the CES device in an insulative/higher impedance state, and application of a voltage $V_{set}$ and a current density $J_{set}$ may place the CES device in a conductive/lower impedance state. That is, a "set" condition may place a variable impeder device, such as CES device 100, into a conductive/lower impedance state, and a "reset" condition may place a variable impeder device, such as CES device 100, into an insulative/higher impedance state, in an embodiment. Following placement of the CES device in a lower impedance state or a higher impedance state, the particular state of the CES device may be detected at least in part by application of a voltage $V_{read}$ (e.g., in a read operation) and detection of a current or current density at terminals, such as electrically conductive terminals 101 and 103, of a variable impeder device, such as CES device 100.

In an embodiment, a CEM of a CES device may include, for example, any transition metal oxide (TMO), such as, for example, peroskovites, Mott insulators, charge exchange insulators, and/or Anderson disorder insulators. In a particular embodiment, a CES device may be formed from materials such as nickel oxide, cobalt oxide, iron oxide, yttrium oxide and peroskovites such as Cr doped strontium titanate, lanthanum titanate, and the manganite family including praesydium calcium manganite, and praesydium lanthanum manganite, to provide a few examples. In an embodiment, oxides incorporating elements with incomplete d and f orbital shells may exhibit sufficient impedance switching properties for use in a CES device. In an embodiment, a CES may be prepared without electroforming. Other embodiments may employ other transition metal compounds without deviating from claimed subject matter. For example, {M(chxn)$_2$Br}Br$_2$ where M may comprise Pt, Pd, or Ni, and chxn comprises 1R,2R-cyclohexanediamine, and other such metal complexes may be used without deviating from the scope of claimed subject matter.

In one embodiment, the CES device of FIG. 1A may comprise materials that comprise TMO variable impedance materials, though it should be understood that these are exemplary only, and are not intended to limit the scope of claimed subject matter. Particular implementations may employ other variable impedance materials as well. Nickel oxide, NiO, is disclosed as one particular TMO. NiO materials discussed herein may be doped with extrinsic ligands, which may stabilize variable impedance properties by passivating the interfacing and allowing for adjustable voltages and impedances, in an embodiment. In a particular embodiment, NiO variable impedance materials disclosed herein may include a carbon containing ligand, which may be indicated by NiO(C$_x$). Here, one skilled in the art may determine a value of x for any specific carbon containing ligand and any specific combination of carbon containing ligand with NiO simply by balancing valences, in an embodiment. In another particular example embodiment, NiO doped with extrinsic ligands may be expressed as NiO(L$_x$), where L$_x$ is a ligand element or compound and x indicates a number of units of the ligand for one unit of NiO. One skilled in the art may determine a value of x for any specific ligand and any specific combination of ligand with NiO or any other transition metal simply by balancing valences, in an embodiment.

According to an embodiment, if sufficient bias is applied (e.g., exceeding a band-splitting potential) and the aforementioned Mott condition is met (injected electron holes=the electrons in the switching region), the CES device may rapidly switch from a conductive/lower impedance state to an insulator state via the Mott transition. This may occur at point 308 of the plot in FIG. 3. At this point, electrons are no longer screened and become localized. This correlation splits the bands to form an insulator. While the CEM of the CES device is still in the insulative/higher impedance state, current may generated by transportation of holes. If enough bias is applied across terminals of the CES device, electrons may be injected into a metal-insulator-metal (MIM) diode over the potential barrier of the MIM device. If enough electrons have been injected and enough potential is applied across terminals to achieve a set condition, an increase in electrons may screen electrons and remove a localization of electrons, which may collapse the band-splitting potential forming a metal, thereby placing the CES device in a conductive/lower impedance state.

As pointed out above, a transition to an insulative/higher impedance state may occur in response to a Mott transition at point 308. As pointed out above, such a Mott transition may occur at a condition in a CEM of a CES device in which a concentration of electrons n equals a concentration of electron holes p. This condition occurs when the following Mott criteria is met, as represented by expression (1) as follows:

$$\lambda_{TF} n^{\frac{1}{3}} = C \sim 0.26 \quad n = \left(\frac{C}{\lambda_{TF}}\right)^3 \tag{1}$$

where: $\lambda_{TF}$ is a Thomas Fermi screening length; and C is a constant which equals approximately 0.26 for the Mott transition.

According to an embodiment, a current or current density in a region 304 of the plot shown in FIG. 3 may exist in response to an injection of holes from a voltage signal applied across terminals, such as terminals 101 and 103, of a variable impeder device, such as CES device 100. Here, injection of holes may meet a Mott transition criterion for the conductive to insulator transition at current $I_{MI}$ as a critical voltage $V_{MI}$ is applied across terminals, such as terminal 101 and 103, of a variable impeder device, such as CES device 100. This may be modeled according to expression (2) as follows:

$$I_{MI}(V_{MI}) = \frac{dQ(V_{MI})}{dt} \approx \frac{Q(V_{MI})}{t} \quad Q(V_{MI}) = qn(V_{MI}) \tag{2}$$

where $Q(V_{MI})$ is the charge injected (hole or electron) and is a function of the applied voltage. As used herein, the notation "MI" signifies a metal-to-insulator transition, and the notation "IM" signifies an insulator-metal transition. That is, "$V_{MI}$" refers to a critical voltage and "$I_{MI}$" refers to a critical current to transition a CEM from a conductive/lower impedance state to an insulative/higher impedance state. Similarly, "$V_{IM}$" refers to a critical voltage and "$I_{IM}$" refers to a critical current to transition a CEM from an insulative/higher impedance state to a conductive/lower impedance state.

Injection of holes to enable a Mott transition may occur between bands and in response to critical voltage $V_{MI}$ and critical current $I_{MI}$. By equating electron concentration n with the needed charge concentration to result in a Mott transition by holes injected by $I_{MI}$ in expression (2) according to expression (1), a dependency of such a critical voltage $V_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \tag{3}$$

$$J_{reset}(V_{MI}) = J_{MI}(V_{MI}) = \frac{I_{MI}(V_{MI})}{A_{CEM}} = \frac{q}{A_{CEM} t}\left(\frac{C}{\lambda_{TF}}\right)^3$$

wherein $A_{CEM}$ is a cross-sectional area of a CEM, such as CEM 102, of a variable impeder device, such as CES device 100, and wherein $J_{reset}(V_{MI})$ depicted at point 308 of example plot 300, is a current density through the CEM, such as CEM 102, to be applied to the CEM at a critical voltage $V_{MI}$ to place the CEM of the CES device in an insulative/higher impedance state. In an embodiment, a CEM may be switched between a conductive/lower impedance state and an insulative/higher impedance state at least in part by a disproportionation reaction.

According to an embodiment, a CEM, such as CEM 102, of a variable impeder device, such as CES device 100, may be placed in a conductive/lower impedance state (e.g., by transitioning from an insulative/higher impedance state) by injection of a sufficient number of electrons to satisfy a Mott transition criteria.

In transitioning a CEM of a CES device to a conductive/lower impedance state, as enough electrons have been injected and the potential across terminals of the variable impeder device overcomes a critical switching potential (e.g., $V_{set}$), injected electrons begin to screen and unlocalize double-occupied electrons to reverse a disproportion reaction and closing the bandgap. A current density $J_{set}(V_{IM})$, depicted at point 314 of FIG. 3, for transitioning the CEM of the CES device to the conductive/lower impedance state in a metal-insulator Mott transition at a critical voltage $V_{IM}$ enabling transition to the conductive/lower impedance state may be represented according to expressions (4) as follows:

$$I_{IM}(V_{IM}) = \frac{dQ(V_{IM})}{dt} \approx \frac{Q(V_{IM})}{t} \quad (4)$$

$$Q(V_{IM}) = qn(V_{IM})$$

$$I_{IM}(V_{IM}) = \frac{Q(V_{IM})}{t} = \frac{qn(V_{IM})}{t} = \frac{q}{t}\left(\frac{C}{a_B}\right)^3$$

$$J_{reset}(V_{IM}) = J_{injection}(V_{IM}) = J_{IM}(V_{IM}) = \frac{I_{IM}(V_{IM})}{A_{CEM}} = \frac{q}{A_{CEM}t}\left(\frac{C}{a_B}\right)^3$$

where: $a_B$ is a Bohr radius.

According to an embodiment, a "read window" 302 for detecting a memory state of a CES device in a read operation may be set out as a difference between a portion 306 the plot of FIG. 3 while the CEM of the CES device is in an insulative/higher impedance state and a portion 304 of the plot FIG. 3 while the CEM of the CES device is in a conductive/lower impedance state at a read voltage $V_{read}$. In a particular implementation, read window 302 may be used to determine the Thomas Fermi screening length $\Delta_{TF}$ of a CEM, such as correlated electron switch material 102, of a variable impeder device, such as CES device 100. For example, at a voltage $V_{reset}$, current densities $J_{reset}$ and $J_{set}$ may be related to according to expression (4a) as follows:

$$\lambda_{TF}(@V_{reset}) = a_B\left(\frac{J_{reset}}{J_{off}}\right)^{\frac{1}{3}} \quad (4a)$$

wherein $J_{off}$ represents a current density of a CEM in an insulative/higher impedance state at $V_{reset}$. See, for example, point 309 of FIG. 3.

In another embodiment, a "write window" 310 for placing a CEM of CES device in an insulative/higher impedance or conductive/lower impedance state in a write operation may be set out as a difference between $V_{reset}$ and $V_{set}$. Establishing $|V_{set}|>|V_{reset}|$ may enable a switch between the conductive/lower impedance and insulative/higher impedance state. $V_{reset}$ may comprise approximately the band splitting potential caused by the correlation and $V_{set}$ may comprise approximately twice the band splitting potential, such that the read window may comprise approximately the band-splitting potential. In particular implementations, a size of write window 310 may be determined, at least in part, by materials and doping of the CEM of the CES device.

In an embodiment, a process for reading a value represented as an impedance state of a variable impeder device, such as CES device 100, may comprise a voltage being applied to a CEM of a CES device. At least one of a current and/or current density within a CEM of a CES device may be measured, and an impedance state of a CEM of a CES device may be determined, at least in part, on the measured current and/or current density, in an embodiment.

Additionally, in an embodiment, an impedance of an impedance state may depend at least in part on a combination of a capacitance and a resistance of a CEM of a CES device. In an embodiment, the determined impedance state may comprise one of a plurality of impedance states. A first impedance state may comprise a lower resistance and lower capacitance, and a second impedance state may comprise a higher resistance and a higher capacitance, for example. Also, in an embodiment, a ratio of the impedances of the plurality of impedance states may be proportional to a physical property of the CEM of the CES device. In an embodiment, the physical property of the CEM of the CES device may comprise at least one of a Thomas Fermi screening length and a Bohr radius. Further, in an embodiment, individual impedance states of the plurality of impedance states may be associated with a data value. Additionally, in an embodiment, a difference in current between a first impedance state and a second impedance state at a predetermined voltage provides an indication of a read window. However, claimed subject matter is not limited in scope in these respects.

In an embodiment, a plurality of electrons may be provided to a CEM of a CES device such that the CES enters a first impedance state. A plurality of holes may be provided to the CEM such that the CES enters a second impedance state. Also, in an embodiment, the plurality of electrons may cause a voltage across the CES to be greater than a set voltage threshold, and the plurality of holes may cause the voltage across the CES to be equal to or greater than a reset voltage threshold. Further, in an embodiment, a voltage across the CEM may cause a current density in the CEM to be equal to or greater than a set current density and/or a set current, and a voltage across the CEM may cause a current density in the CEM to be equal to or greater than a reset current density and/or a reset current.

Also, in an embodiment, a set voltage across the CEM and a set current density through a CEM of a CES device may be exceeded. Additionally, a reset voltage across a CEM and a reset current density through a CEM of a CES device may be exceeded. Further, in an embodiment, individual impedance states of a plurality of impedance states may be associated with a data value.

In an embodiment, at least one of a reset voltage, a set voltage, and a difference between the set voltage and the reset voltage are proportional to a physical property of a CEM of a CES device. A physical property of a CEM may include at least one of a strong electron potential due to localization, and/or a correlation of electrons, for example. Also, in an embodiment, a difference in the set voltage and the reset voltage may provide an indication of a size of at least one of a write/program window.

Figure 4:
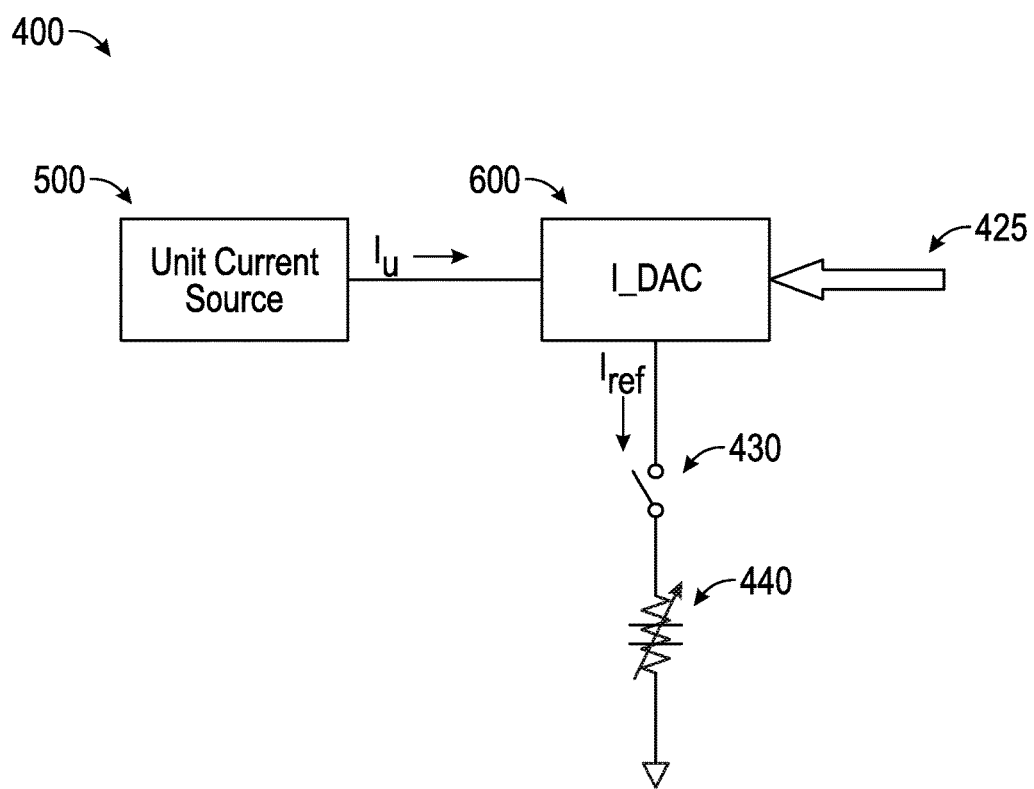
FIG. 4 is a schematic block diagram of an example circuit for providing a programmable current for a correlated electron switch.

FIG. 4 is a schematic block diagram of an example embodiment 400 of a circuit for providing a programmable current for a variable impeder device, such as CES device 440 in accordance with an embodiment. As mentioned above, transitioning a variable impeder device, such as CES device 100/440, from conductive/lower impedance state to an insulative/higher impedance state (i.e., a reset condition) or from an insulative/higher impedance state to a conductive/lower impedance state (i.e., a set condition) may require a current through a CES device sufficient to cause a Mott or Mott-like transition to occur in the CEM of the CES device at a given voltage. As can be seen in FIG. 3, different amounts of current/current density and/or voltage may be applied to a CES to cause particular impedance state transitions. For example, as seen in FIG. 3, to achieve a reset condition to cause a transition from a conductive/lower impedance state to an insulative/higher impedance state, a voltage $V_{reset}$ may be applied across a CES device, and a current density $J_{reset}$ may be achieved in the CES device. Both the voltage and current conditions need to be met, in an embodiment, before a reset condition can be achieved resulting in a transition from a conductive/lower impedance state to an insulative/higher impedance state. Similarly, as also seen in FIG. 3, to achieve a set condition to cause a transition from an insulative/higher impedance state to a conductive/lower impedance state, a voltage $V_{set}$ may be applied across a CES device, and a current density $J_{set}$ may be achieved in the CES device. Again, both the voltage and current conditions need to be met, in an embodiment, before a set condition can be achieved resulting in a transition from an insulative/higher impedance state to a conductive/lower impedance. Also, it may be noted that different current and/or voltage levels may be needed for set and reset conditions, in an embodiment.

To produce different levels of current in a variable impeder device, such as CES 100, example circuit 400 for providing a programmable current to a CES device, such as CES device 440 depicted in FIG. 4, may comprise an example current source, such as unit current source 500, coupled to an example programmable current source, such as digital-to-analog converter current source (I_DAC) 600. In an embodiment, unit current source 500 may provide an amount of current, such as a "unit" amount, to a programmable current source, such as I_DAC 600. Also, in an embodiment, a programmable current source, such as I_DAC 600, may provide multiples of a unit current, such as provided by unit current source 500, for example, to a CES device, such as CES device 440. As depicted in FIG. 4, a programmable current for a CES device, such as CES device 440, may be referred to as a reference current ($I_{ref}$) although claimed subject matter is not limited in scope in this respect.

Example circuit 400 may further include an enable switch, such as switch 430, that may couple a programmable current source, such as I_DAC 600, to a variable impeder device, such as CES device 440, in an embodiment. For example, for a read operation involving CES device 440, switch 430 may remain open, thereby decoupling the output of I_DAC 600 from CES device 440 during the read operation. For a write operation, switch 430 may be closed to allow I_DAC 600 to provide a current for a set or reset condition, as appropriate. In an embodiment, switch 430 may comprise a transistor that may conduct in response to an enable signal, for example.

As depicted in FIG. 4, a digital code 425 may be provided to a programmable current source, such as I_DAC 600, in an embodiment. For example, a programmable current device, such as I_DAC 600, may generate various levels of current in accordance with a digital code, such as digital code 425. In an embodiment, a first current level appropriate for a set condition (i.e., a transition from an insulative/higher impedance state in a CES device) may be specified by a first digital code, and a second current level appropriate for a reset condition (i.e., a transition from a conductive/lower impedance state in a CES device) may be specified by a second digital code. Current levels for set and/or reset conditions may be adjusted if desirable, such as to compensate for variations in process, voltage, and/or temperature, for example, by adjusting the digital code, in an embodiment. In this manner, a programmable current source, such as I_DAC 600, may be programmed and/or adjusted to generate currents for set and/or reset conditions for a variable impeder device, such as CES device 440.

Figure 5A:
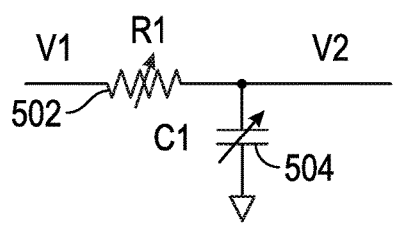
FIG. 5A is a schematic diagram of a passive low-pass first order filter network in accordance with an embodiment.

Referring to FIG. 5A, a schematic diagram of a passive low-pass first order filter network 500 comprises a conventional resistive element replaced by a CES device 502. The low-pass first order filter network 500 is shown with a capacitance element 504, input signal V1 and filtered output signal V2.

Figure 5B:
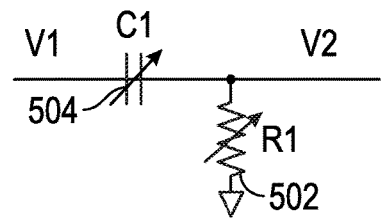
FIG. 5B is a schematic diagram of a passive high-pass first order filter network in accordance with an embodiment.

In FIG. 5B, a schematic diagram of a high-pass first order filter network 506 comprises a conventional resistive element replaced by a CES device 502. The high-pass first order filter network 506 is likewise shown with a capacitance element 504, input V1 and filtered output V2.

In operation, an input signal V1 is filtered such that a pass band of either filter circuit 500, 506 outputs as signal V2 only those input signals that are in a desired range of frequencies. A known parameter to describe the behavior of filter circuits is a voltage transfer function in the frequency domain: H(s) where s is a complex number, having both a magnitude and a phase. In general, filters introduce a phase difference between input and output signals.

For the passive low-pass first order filter network 500, the transfer function may be expressed as equation (5):

$$H(s) = \frac{1}{1+sR1C1} \quad (5)$$

For the active high-pass first order filter network 506, the transfer function may be expressed as equation (6):

$$H(s) = \frac{sR1C1}{1+sR1C1} \quad (6)$$

Programming a CES element permits control of its resistive state and therefore permits control over the resistance or impedance value in ohm Ω of the CES element. Tuning of the resistance may occur on a substrate such as on silicon and the resistive elements 502 R1 may be used for gross tuning whilst the capacitor elements C1 504 used for fine tuning. As described above, and in-connection with FIG. 7, further fine tuning of the CES element may be carried out using compliance current limits to adjust the low resistance state (LRS).

Figure 6:
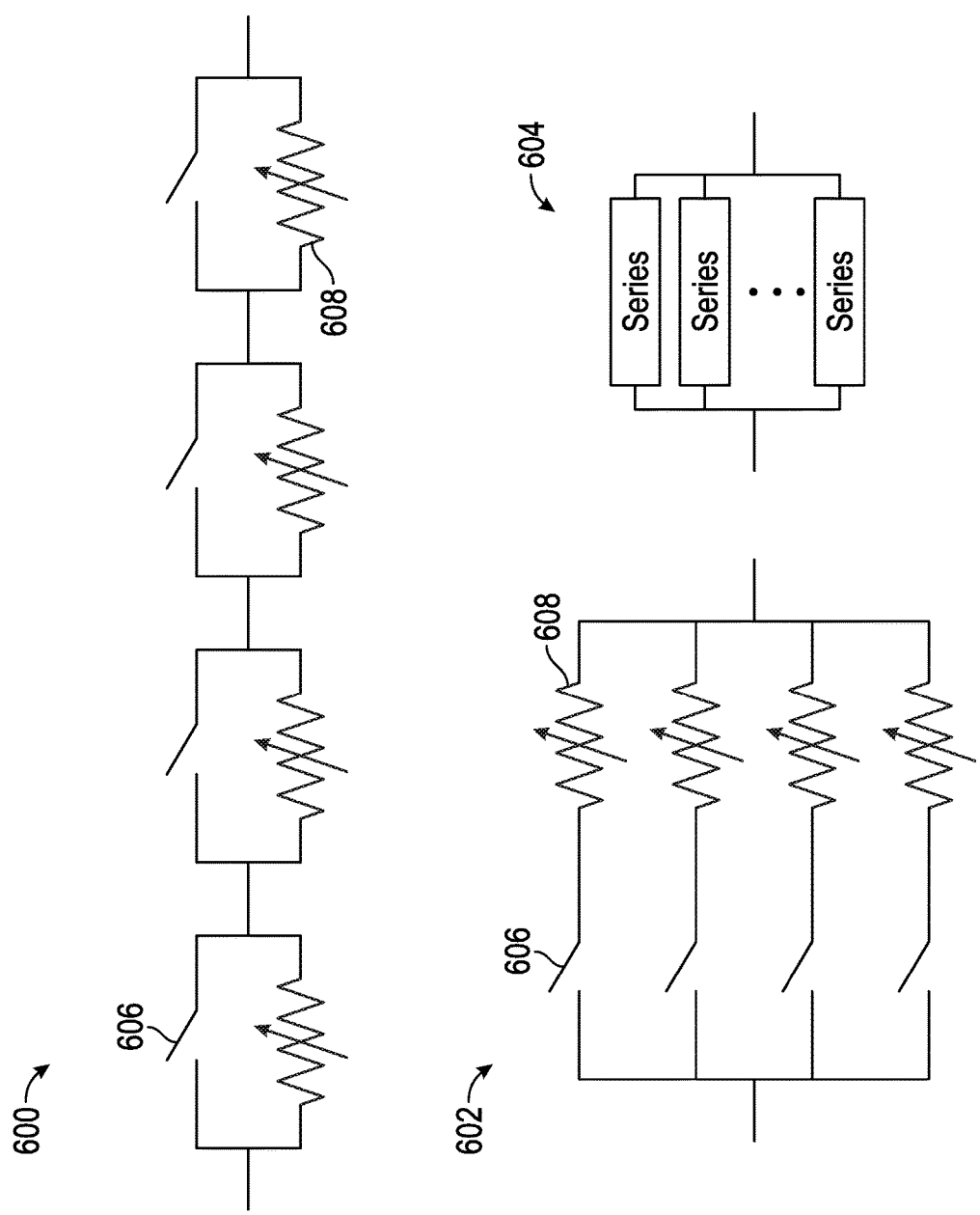
FIG. 6 is a schematic diagram of a correlated electron device array in a series or parallel arrangement in accordance with an embodiment.

Referring to FIG. 6, a correlated electron device array formed of correlated electron devices 608 is formed in a series arrangement 600, a parallel arrangement 602 or as a combination of both series and parallel 604. The series arrangement 600 and the parallel arrangement 602 comprise bypass switches 606 such as a metal-oxide-semiconductor field effect transistor (MOSFET). The bypass switches 606 are controlled from a digital register (not shown in FIG. 6) enabling a logic 0 or 1 to connect or bypass a correlated electron device 608 and change the effective resistance.

When designing the arrangement of FIG. 6, the bypass switches 606 and the correlated electron device 608 can be used in various combinations of design, one example of the design is shown in arrangement 604. The properties of the bypass switch 606 in the case of a MOSFET its size, in embodiments may be chosen such that the Ron of the MOSFET is much less than the Ron of correlated electron device 608 that is being bypassed.

In an example of the operation of the schematic shown in FIG. 6, given a value of 100 kΩ of a low resistance state (LRS) then using a bank of five correlated electron devices 608 in series can give a total resistance of 500 kΩ. If arranged in parallel, this same bank of five correlated electron devices 608 will give 20 kΩ. For a high resistance state (HRS) of 10 MΩ then a bank of five correlated electron devices 608 in series can give a total resistance of 50 MΩ. If arranged in parallel, the five correlated electron devices 608 will give 2 MΩ. If all the bypass switches 608 are closed then a series and parallel connection of the correlated electron devices 608 is provided, which give a RLRS of 100 KΩ and RHRS of 10 MΩ. By appropriately closing and opening the bypass switches 606, various series and parallel combinations of correlated electron devices 608 can be obtained.

Figure 7:
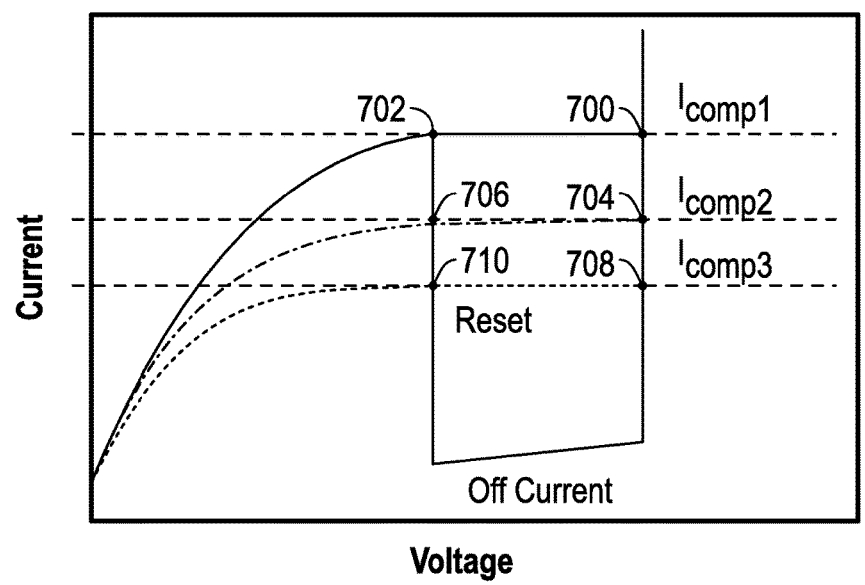
FIG. 7 is a schematic diagram of using compliance current to adjust a low resistance value of a correlated electron device in accordance with an embodiment.

Referring to FIG. 7, a use of compliance current may adjust a low resistance value of a correlated electron device according to an embodiment. Therefore, a current in a correlated electron material of a correlated electron switch device may be controlled by an externally applied "compliance" condition determined based, at least in part, on the external current limited during a write operation to achieve a set condition to place the CES device in a conductive/lower impedance state. This externally applied compliance current also sets the subsequent reset condition current density requirement. As shown in the particular implementation of FIG. 7, a current density Icomp1 applied during a write operation at point 700 to place the CES device in a conductive/lower impedance state may provide an Ion at point 702 given by the expression as equation (7)

$$Ion = Icomp1 \cdot C(exp(V)) \cdot \sqrt{V} \qquad (7)$$

It will be understood that a low resistance state can be modified by setting the compliance current, because the Ion in the low resistance state varies directly proportional with the compliance current. Therefore, an Icomp2 704 may provide an Ion value at 704 lower than provided by Icomp1 700. An Icomp3 708 may provide an Ion value at 710 lower still. Therefore, by combining the setting of the compliance current with the series and parallel configuration of the CES elements, the filter transfer function can be programmed.

Figure 8:
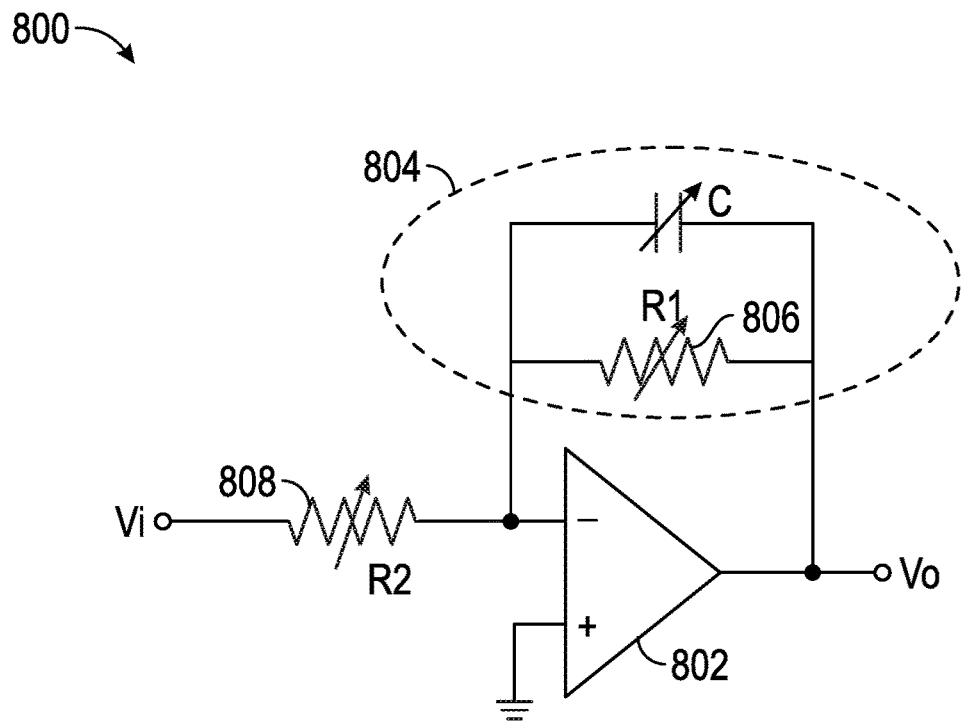
FIG. 8 is a schematic diagram of an active analogue filter with application as a low-pass filter.
Figure 8:
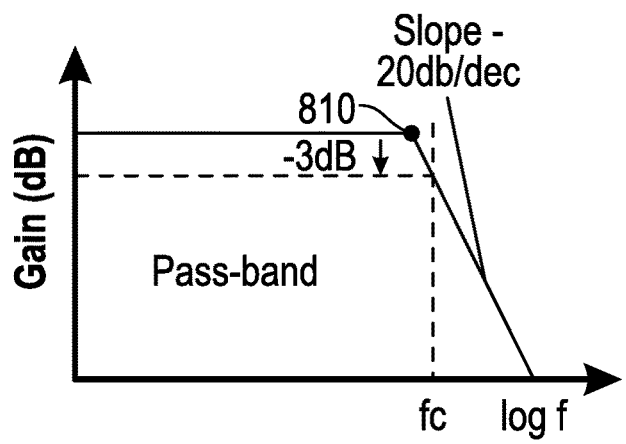

FIG. 8 is a schematic diagram of an active analogue filter with application as a low-pass filter circuit 800 in accordance with an embodiment. The low-pass filter 800 comprises an operational amplifier 802 for amplification and gain control. The operational amplifier 802 is connected to a RC low-pass filter circuit 804. The RC low-pass filter circuit 804 comprises a correlated electron device 806 as a resistive and capacitive element. An input resistive element 808 may also be a correlated electron device where R1 is in a high resistance state such as 10 kΩ and R2 is in a low resistive state such as 100Ω.

The frequency response of the low-pass filter 800 is the same as for a passive RC filter, except that the amplitude of the output is increased by the pass band DC gain, $A_V$ of the amplifier. For an inverting amplifier circuit, the magnitude of the voltage gain for the filter is given as a function of the feedback resistor (R1) divided by its corresponding input resistor (R2) value and is given as equation (8):

$$Av = -\frac{R1}{R2} \qquad (8)$$

A high cut-off or corner frequency point 810 is a value where frequencies below this corner frequency are passed by the low-pass filter 800. The corner frequency point 810 is given by equation (9):

$$fc = \frac{1}{2\pi R1 C1} Hz \qquad (9)$$

Figure 9:
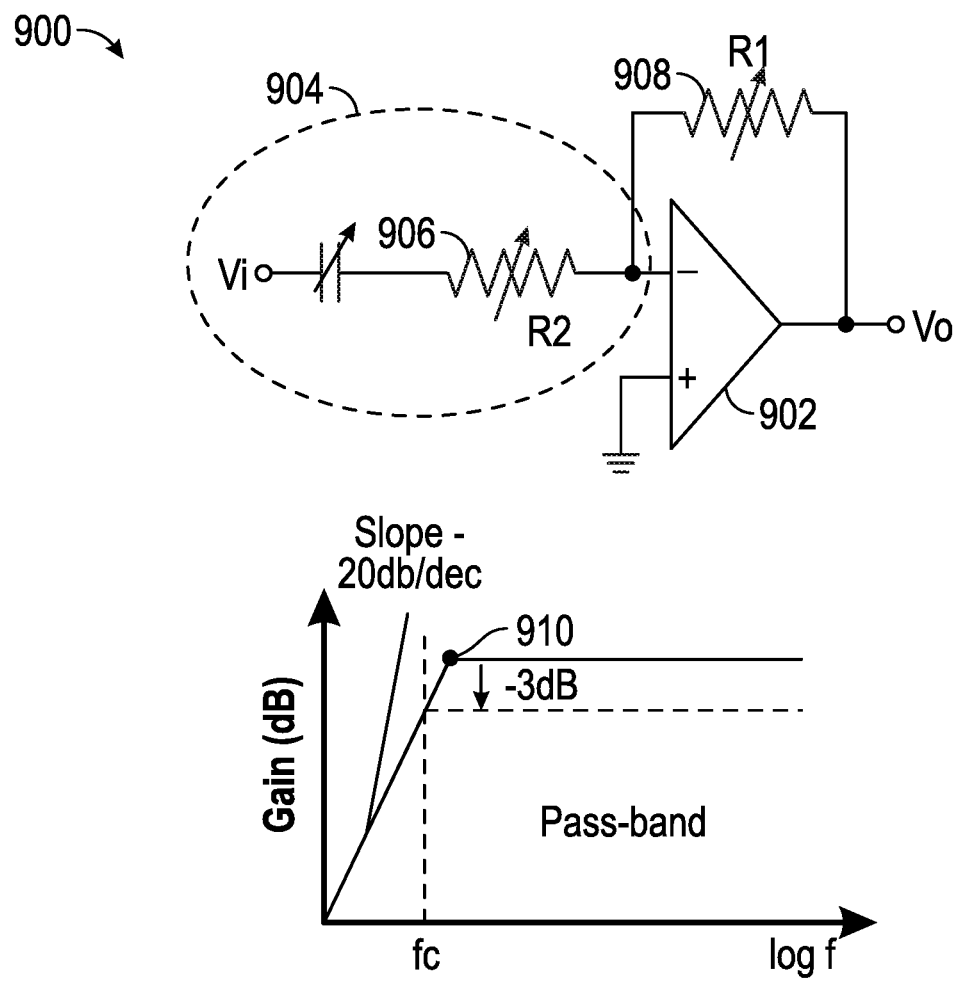
FIG. 9 is a schematic diagram of an active analogue filter with application as a high-pass filter in accordance with an embodiment.

FIG. 9 is a schematic diagram of an active analogue filter with application as a high-pass filter circuit 900 in accordance with an embodiment. The high-pass filter 900 comprises an operational amplifier 902 for amplification and gain control. The operational amplifier 902 is connected to a RC high-pass filter circuit 904. The RC high-pass filter circuit 904 comprises a correlated electron device 906 as a resistive and capacitive element. A feedback resistive element 908 may also be a correlated electron device where R1 is in a high resistive state such as 10 kΩ and R2 is in a low resistive state such as 100Ω.

The frequency response of the high-pass filter 900 is the same as for a passive RC filter, except that the amplitude of the output is increased by the pass band DC gain, $A_V$ of the amplifier. For an inverting amplifier circuit, the magnitude of the voltage gain for the filter is given as a function of the feedback resistor 908 (R1) divided by its corresponding input resistor (R2) 906 value and is given as equation (10):

$$Av = -\frac{R1}{R2} \qquad (10)$$

The cut-off or corner frequency point 910 is a value where frequencies above this low cut-off frequency are passed by the high-pass filter 900. The corner frequency point 910 is given by equation (11):

$$fc = \frac{1}{2\pi R2 C1} Hz \qquad (11)$$

Figure 10:
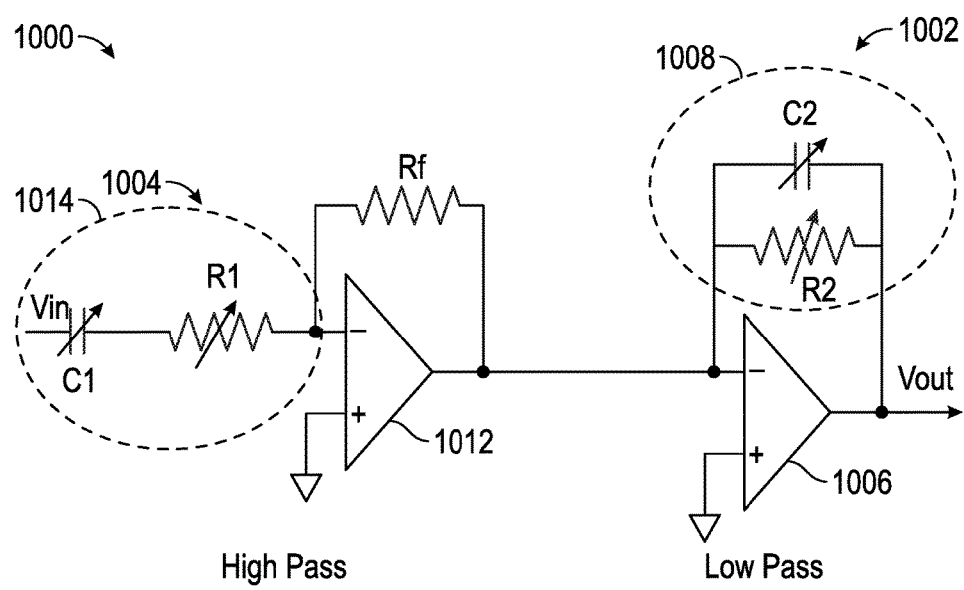
FIG. 10 is a schematic diagram of a bandpass filter in accordance with an embodiment.

FIG. 10 is a schematic diagram of a bandpass filter circuit 1000 in accordance with an embodiment. The order of the high pass and low pass filter may be switched and the representation in FIG. 10 is only one representation. The bandpass filter circuit 1000 is a frequency selective filter circuit used in electronic systems to separate a signal at one particular frequency, or a range of signals that lie within a certain "band" of frequencies from signals at all other frequencies. This band or range of frequencies is set between two cut-off or corner frequency points such as the higher frequency point given by fc(h) in equation 12:

$$fc(h) = \frac{1}{2\pi R1 C1} Hz \qquad (12)$$

and a lower frequency point fc(l) in equation 13:

$$fc(l) = \frac{1}{2\pi R2C2} \text{Hz} \quad (13)$$

An active bandpass filter circuit 1000 can be formed by cascading together a single low pass filter circuit 1002 with a single high pass filter circuit 1004 as shown in FIG. 10. The active bandpass filter circuit 1000 will function as a bandpass filter when fc(l) is higher than fc(h).

The single low pass filter circuit 1002 comprises an operational amplifier 1006 for amplification and gain control. The operational amplifier 1006 is connected in its feedback path to a RC low-pass filter circuit 1008 comprising a correlated electron device 1010 as a resistive R2 and capacitive element C2. The resistive R2 and capacitive C2 elements are used to tune the transfer function of the low-pass filter circuit 1008.

An input to the single low pass filter circuit 1002 is the output of the single high pass filter circuit 1004. The single high pass filter circuit 1004 comprises an operational amplifier 1012 having a RC high-pass filter circuit 1014 at an input path to the operational amplifier 1012 comprising a correlated electron device 1016 as a resistive R1 and capacitive element C1. The resistive R1 and capacitive C1 elements are used to tune the transfer function of the high-pass filter circuit 1014. For example, if R2=100 kΩ and R1=10 MΩ then a bandpass filter circuit can be provided.

Figure 11:
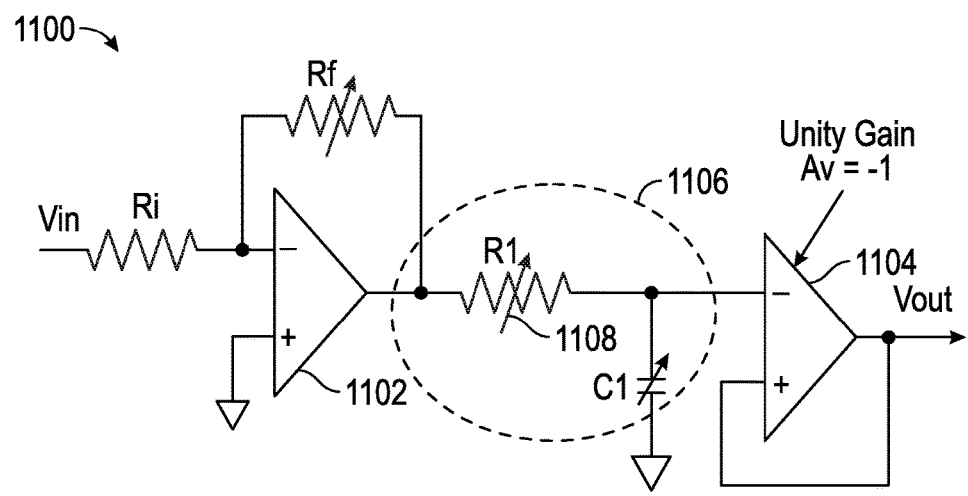
FIG. 11 is a schematic diagram of a bandwidth filter in accordance with an embodiment.

FIG. 11 is a schematic diagram an analog filter 1100 in accordance with an embodiment. To separate the gain and bandwidth tuning, two operational amplifiers 1102 and 1104 are provided in a configuration where the first operational amplifier 1102 or preamplifier is used for Gain adjustment and the second amplifier 1104 or post-amplifier in a unity gain for buffering the filter transfer function. An RC filter circuit 1106 is connected to an output of the first operation amplifier 1102 and an input of the second operational amplifier 1104 and comprises a correlated electron device 1108 as a resistive R1 and capacitive element C1. The gain of the filter is set by adjusting the feedback resistor Rf on amplifier 1102. The gain is represented in equation (8). The filter cut-off frequency is adjusted with the resistor R1 and capacitor C1 connected to the output of amplifier 1102. The filter cut-off frequency is shown in equation (9).

Figure 12:
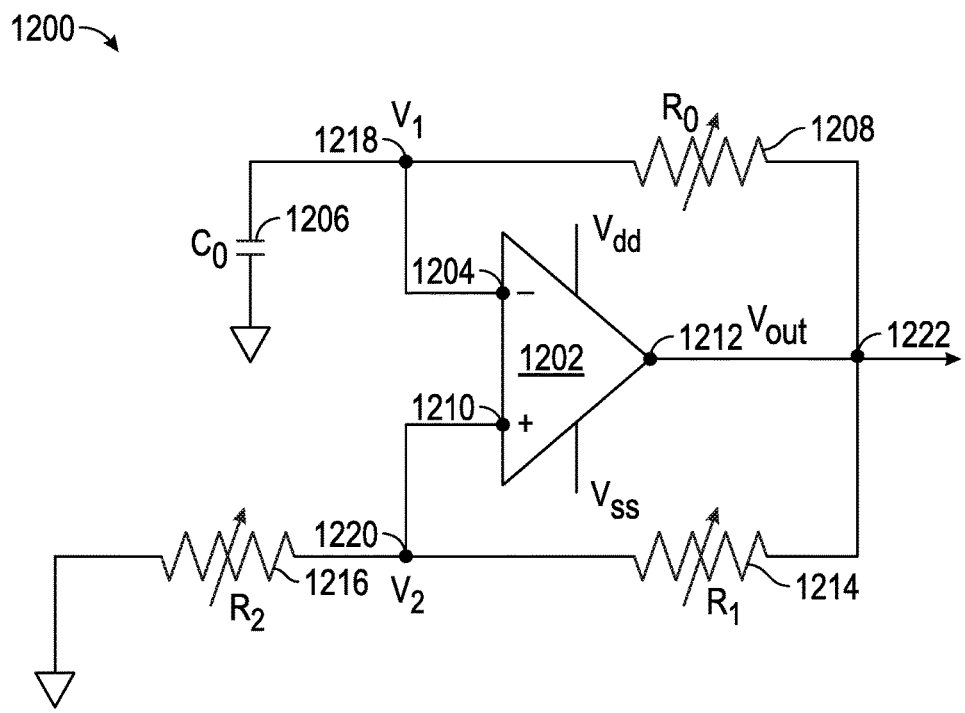
FIG. 12 is a schematic diagram of a relaxation oscillator in accordance with an embodiment.

FIG. 12 is a schematic diagram of a relaxation oscillator 1200 in accordance with an embodiment. Referring to FIG. 12, a comparator 1202 comprises a negative input terminal 1204 connected between a capacitor 1206 and feedback resistor R0 1208 at a node 1218 shown as V1. The feedback resistor R0 1208 is also connected to an output terminal 1212 of the comparator 1202 and the capacitor 1206 is connected to ground. A positive input terminal 1210 of the comparator 1202 is connected between a first resistive element 1214 R1 and a second resistive element 1216 R2 at a node 1220 shown as V2. The second resistive element 1216 R2 is connected between ground and the first resistive element 1214 R1, whereas the first resistive element 1214 R1 is connected to the output terminal 1212 of the comparator 1202. A node 1222 is shown as Vout where the feedback resistor R0 1208 and the first resistive element R1 1214 are connected to the output terminal 1212 of the comparator 1202. As is known in the art, the output Vout may take the value Vdd or Vss depending upon a comparison between an input and a reference voltage. The oscillator frequency $f_c$ (if R1=R2) by equation 14:

$$fc = \frac{1}{2\ln(3)RC} \quad (14)$$

In embodiments of the relaxation oscillator 1200, the feedback resistor 1208, the first resistive element R1 1214 and the second resistive element 1216 R2 are provided by correlated electron material elements.

In operation, initially V1=0, V2>0 and Vout=1 and so capacitor C0 charges via R0 (where the time constant=RC). When V1>V2; Vout tends towards 0 and the capacitor C0 discharges via R0.

The output swing on Vout is rail-to-rail, with switching frequency dependent on the values of R and C and ratio of R1 and R2.

If R1=R2 then V2 switches between Vdd/2 and Vss/2

V2 can be changed with other values of R1/R2 and thereby changing the oscillation frequency The output duty cycle can also be varied (for something other than 0.5 if |Vdd|*|Vss|.

It will be clear to one skilled in the art that many improvements and modifications can be made to the foregoing exemplary embodiments without departing from the scope of the present techniques.

Accordingly, present techniques provide for an electronic filter circuit comprising resistive and capacitive elements, wherein at least one resistive element of the electronic circuit is provided by a correlated electron material device.

In embodiments, the correlated electron material device has a programmed impedance value. In embodiments, a programmable current source is used to generate a current at least in part to cause a transition in the correlated electron material device from a first impedance state to a second impedance state. The programmable current is generated in accordance with a digital code. The digital code may specify a current level of a plurality of current levels available from the programmable current source.

In embodiments, the resistive element of the filter circuit is formed of an array of correlated electron material devices arranged in a series combination and connected together by switching elements.

In embodiments, the resistive element of the filter circuit is formed of an array of correlated electron material devices arranged in a parallel configuration and connected together by switching elements.

In embodiments, the switching elements are controlled from a digital register. The switching elements are operable to connect or bypass one or more correlated electron elements in the array under the control of digital bit(s) and thereby change the impedance of the resistive element.

According to techniques, the electronic filter circuit may form part of a tuneable analogue filter circuit, which may be a Radio Frequency (RF) filter circuit, a RC passive or active filter circuit.

Accordingly, present techniques also provide a method of programming a transfer function of an electronic filter circuit, wherein a resistive element of the filter circuit is provided by a correlated electron material device; the method comprising: providing a programmable current source to generate a current at least in part to cause a transition in the correlated electron material device from a first impedance state to a second impedance state and setting a programmed impedance value at the transitioned impedance state.

In embodiments, providing the programmable current to the correlated electron material device may comprise generating the programmable current in accordance with a digital code. The digital code may specify a current level of a plurality of current levels available from a programmable current source.

Embodiments may include setting a compliance current of the correlated electron material device to modify the correlated electron material resistance in a low resistance state and so set a programmed impedance value.

Accordingly, present techniques include a method of tuning a resistance of an electronic filter circuit, wherein a resistive element of the filter circuit is provided by an array of correlated electron material devices; the method comprising selectively addressing the array of correlated electron material devices.

In embodiments, the tuning includes bypassing or connecting one of more correlated electron material devices together in the array using switching elements. In embodiments, the tuning includes controlling the switching elements using a digital register which may include setting a number of bits to a logic 1 to connect or bypass the correlated electron material devices and so change the impedance of the resistive element.

The invention claimed is:

1. An electronic filter circuit comprising resistive and capacitive elements, wherein the resistive element of the filter circuit is provided by a correlated electron material device, wherein the electronic filter circuit includes a programmable current source to generate a current at least in part to cause a transition in the correlated electron material device from a first impedance state to a second impedance state, wherein the current is generated in accordance with a digital code.

2. An electronic filter circuit as claimed in claim 1, wherein the correlated electron material device has a programmed impedance value.

3. An electronic filter circuit as claimed in claim 1, wherein the electronic filter circuit forms part of a Radio-Frequency (RF) filter circuit.

4. An electronic filter circuit as claimed in claim 1, wherein the electronic filter circuit forms part of a RC passive or active filter circuit.

5. An electronic filter circuit as claimed in claim 1, wherein the digital code specifies a current level of a plurality of current levels available from the programmable current source.

6. An electronic filter circuit as claimed in claim 1, wherein the resistive element of the filter circuit is formed of an array of correlated electron material devices arranged in a series combination and connected together by switching elements.

7. An electronic filter circuit as claimed in claim 6, wherein the switching elements are controlled from a digital register.

8. An electronic filter circuit as claim in claim 7, wherein the switching elements are operable to connect or bypass one or more correlated electron elements in the array under the control of digital bit(s) and thereby change an impedance of the resistive element.

9. An electronic filter circuit as claimed in claim 1, wherein the resistive element of the filter circuit is formed of an array of correlated electron material devices arranged in a parallel configuration and connected together by switching elements.

10. An electronic filter circuit as claimed in claim 9, wherein the switching elements are controlled from a digital register.

11. An electronic filter circuit as claimed in claim 1, wherein the electronic filter circuit forms part of a tunable analog filter circuit.

12. A method of programming a transfer function of an electronic filter circuit, wherein a resistive element of the filter circuit is provided by a correlated electron material device; the method comprising: providing a programmable current source to generate a current at least in part to cause a transition in the correlated electron material device from a first impedance state to a second impedance state and setting a programmed impedance value at the second impedance state, wherein providing the programmable current to the correlated electron material device comprises generating the programmable current in accordance with a digital code.

13. A method as claimed in claim 12, wherein the digital code specifies a current level of a plurality of current levels available from the programmable current source.

14. A method as claimed in claim 12, including setting a compliance current of the correlated electron material device to modify a resistance of the correlated electron material device in a low resistance state and so set a programmed impedance value.

15. A method of tuning a resistance of an electronic filter circuit, wherein a resistive element of the filter circuit is provided by an array of correlated electron material devices; the method comprising selectively addressing the array of correlated electron material devices.

16. A method as claimed in claim 15, including bypassing or connecting one of more correlated electron material devices together in the array using switching elements.

17. A method as claimed in claim 16, including controlling the switching elements using a digital register.

18. A method as claimed in claim 17, including setting a number of bits to a logic 1 to connect or bypass the correlated electron material devices and so change an impedance of the resistive element.

* * * * *